(12) United States Patent
Gregg et al.

(10) Patent No.: US 6,880,592 B2
(45) Date of Patent: Apr. 19, 2005

(54) CANISTER GUARD

(75) Inventors: John N. Gregg, Marble Falls, TX (US); Donn Naito, Marble Falls, TX (US)

(73) Assignee: Advanced Technology Materials, Inc., Danbury, CT (US)

( * ) Notice: Subject to any disclaimer, the term of this patent is extended or adjusted under 35 U.S.C. 154(b) by 0 days.

(21) Appl. No.: 10/606,520

(22) Filed: Jun. 26, 2003

(65) Prior Publication Data

US 2004/0261896 A1    Dec. 30, 2004

(51) Int. Cl.[7] .......................................... F17C 13/00
(52) U.S. Cl. ........................ 141/286; 141/1; 141/4; 141/7; 141/8; 141/18; 141/44; 141/48; 141/63; 141/64; 141/65; 141/66
(58) Field of Search ..................... 141/1, 2, 4, 5, 141/7, 8, 19, 21, 44, 47, 48, 54, 59, 86, 63–66, 141/286; 222/108, 109; 55/444, 465

(56) References Cited

U.S. PATENT DOCUMENTS

| | | | |
|---|---|---|---|
| 4,628,689 A * | 12/1986 | Jourdan ........................ 60/295 |
| 5,500,116 A * | 3/1996 | Nakayama et al. .......... 210/511 |
| 5,607,002 A | 3/1997 | Siegele | |
| 6,431,229 B1 * | 8/2002 | Birtcher et al. ............. 141/302 |
| 6,520,218 B1 | 2/2003 | Gregg et al. | |
| 2003/0124262 A1 | 7/2003 | Chen et al. | |

* cited by examiner

Primary Examiner—Gregory L. Huson
Assistant Examiner—Peter deVore
(74) Attorney, Agent, or Firm—Margaret Chappuis; Steven Hultquist, Esq.

(57) ABSTRACT

A canister guard for preventing liquid contamination of an oulet to a canister containing liquid. The canister guard may include baffles extending from a sidewall. Additionally, the canister guard may be configured to be replaceable or for retrofitting to conventional liquid chemical containing canisters.

26 Claims, 4 Drawing Sheets

CANISTER GUARD

BACKGROUND

Embodiments described relate to a guard for preventing liquid contamination to an inlet of a canister containing a liquid. In particular, embodiments include a guard and a guarded coupling coupled to the inlet during purging of a liquid chemical from lines coupled to the canister.

BACKGROUND OF THE RELATED ART

The importance of high purity chemical maintenance has increased over the years. For example, chemical impurities can have a significant affect when present in chemicals used in the fabrication of semiconductor devices. That is, as semiconductor device features, such as metal lines, become smaller and smaller, the impact any particular contaminant may have increases.

Maintaining the condition of high purity chemicals requires added care in packaging, transport and delivery to, for example, a semiconductor tool. By way of example, a high purity semiconductor liquid chemical may be transported in a canister. The canister may be coupled to a semiconductor tool such as a chemical vapor deposition apparatus. The canister is coupled to the tool by way of an outlet from the canister. In particular, a delivery line may be coupled to the outlet. By way of depressurization through the delivery line, the high purity semiconductor chemical is delivered from the canister, through the outlet and eventually to the semiconductor tool. An inlet orifice may also be provided to the canister to allow cooperative pressurization during this process. For example, an inert gas such as helium may be forced into the canister through the inlet orifice to help evacuate the high purity liquid chemical therefrom. In this manner, the high purity liquid semiconductor chemical is made available for use by the tool for semiconductor processing applications.

When a particular semiconductor processing application is completed, depressurization through the delivery line and pressurization through the inlet orifice is terminated. Additionally, the canister of liquid chemical may be replaced. In order to ensure purity from one semiconductor application, such as that described above, to another, it is often necessary to first purge the delivery line before replacing the canister. In this manner, a clean delivery line may be coupled to a subsequent canister without risk of contamination by the initial high purity chemical. That is, this is an attempt to allow a clean delivery of a subsequent high purity semiconductor chemical by the same tool and through the same delivery line. Purging of the delivery line in this manner also ensures safety for the user attempting to replace the initial canister.

Any number of line purging techniques may be employed through pressurization and depressurization of the canister through the delivery and other lines. In many cases, this may include pressurization applied through the delivery line and into the canister as a manner of purging the delivery line. In this manner, any residual high purity liquid chemical in the delivery line is purged back into the canister.

As the purged high purity chemical is forced back into the canister, the inlet orifice remains open to allow the rapid pressurization through the delivery line. However, at this time, splashing and spattering often occurs. Unfortunately, this may lead to contamination of the inlet orifice and its associated line with the high purity liquid chemical. As a result, a subsequent canister cannot be coupled to the system without risk of contamination by the high purity liquid chemical. Additionally, replacement of the canister as described above now poses a potential health risk to the user by exposure to the high purity liquid chemical contaminant at the inlet.

SUMMARY

In one embodiment a canister guard is provided for coupling to a canister at an outlet thereof. The canister guard may prevent liquid from exiting through the outlet when pressure is applied through a canister inlet of the canister.

DETAILED DESCRIPTION

While embodiments are described with reference to certain liquid delivery systems, embodiments may be applicable to any liquid delivery system requiring a purge of a liquid delivery line. Additionally, embodiments may be particularly useful when the liquid is susceptible to contamination or poses a potential health risk.

Figure 1:
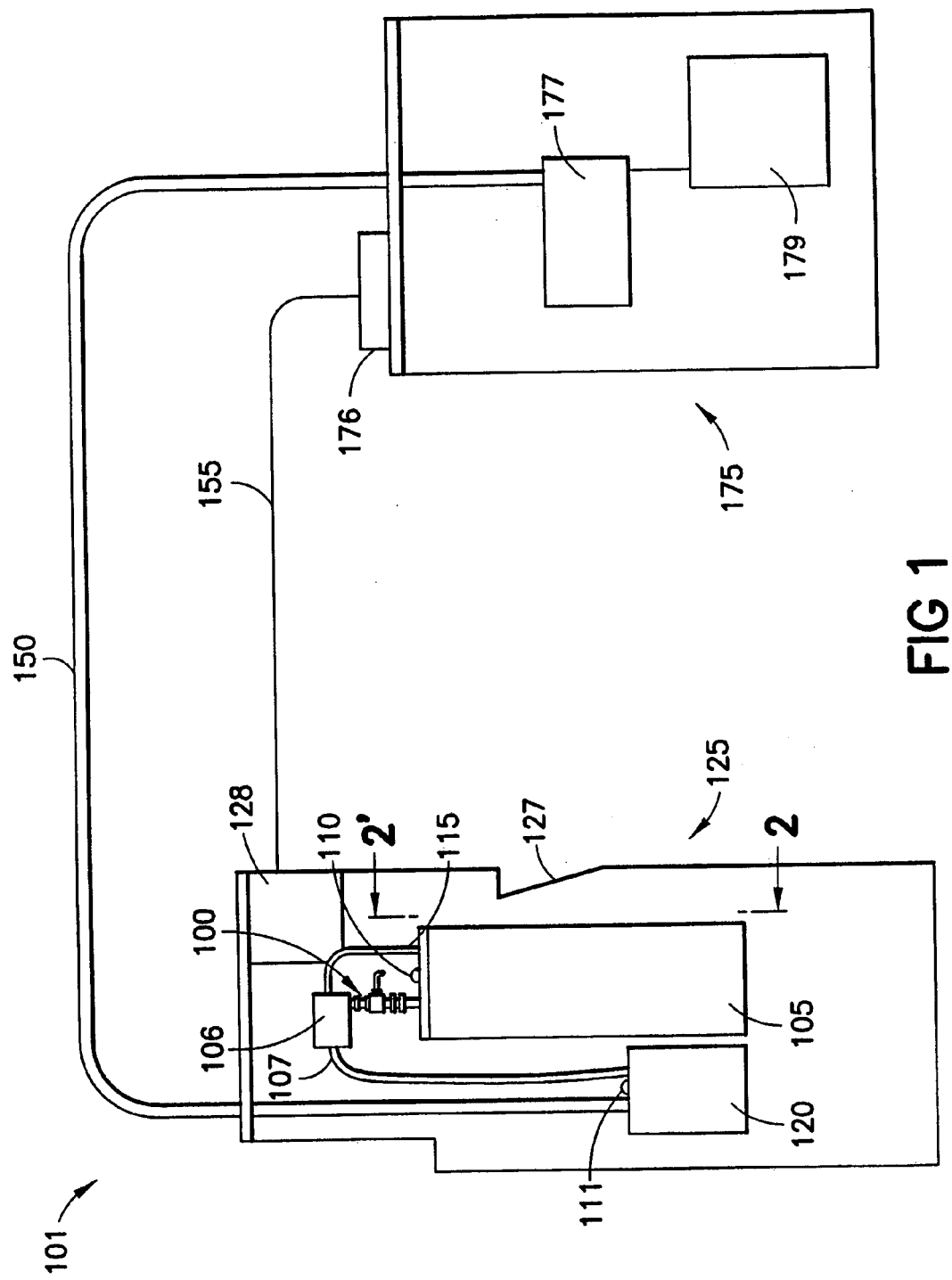
FIG. 1 is a side view of a chemical delivery system employing a container having an embodiment of a guarded line.

Referring to FIG. 1, a chemical delivery system 101 is shown. The chemical delivery system 101 includes a remote cabinet 125 which is physically and electronically coupled to a reactor 175 as shown. In other embodiments, the remote cabinet 125 may be coupled to other semiconductor fabrication equipment. However, in the embodiment shown, the reactor 175 is for chemical vapor deposition (CVD) where a liquid chemical such as tetraethylorthosilicate (TEOS) is delivered to a surface of a semiconductor substrate to form a TEOS film thereat. The TEOS may be delivered in this manner as part of a conventional semiconductor fabrication technique. Additionally, other semiconductor materials such as titanium tetrachloride, tetramethylcyclotetrasiloxane, tetrakis dimethylamino titanium, tetraethylorthosilicate, trimethylborate, triethylborate, trimethylphosphite, trimethylphosphate, triethylphosphate, trimethyl silane, and others may be employed.

In the embodiment shown in FIG. 1, a bulk canister 105 is coupled to a process canister 120 (or ampule) through a manifold assembly 106. The manifold assembly 106 couples to the bulk canister 105 through a delivery line 115 and a guarded coupling 100. The manifold assembly 106 similarly couples to the process canister through a refill line 107. Through a series of pressurization and depressurization techniques, the manifold assembly 106 allows delivery of liquid chemical from the bulk canister 105 and for purging of the delivery line 115 as described further herein.

With the chemical delivery system 101 of FIG. 1, a liquid chemical, such as that indicated above, may be driven from the bulk canister 105 to the process canister 120 for eventual delivery to the reactor 175 through a transfer line 150. The bulk canister 105 may be a removable container for storing between about 5 and about 10 gallons of liquid chemical, whereas the process canister 120 may be a smaller container remaining in place within the remote cabinet 125. In another embodiment, however, the bulk canister 105 is coupled directly to the reactor 175 and no process canister 120 is present.

Delivery of liquid chemical may be directed by a user at a user interface 127 of the remote cabinet 125. The user interface 127 may be a touch screen coupled to a central processor of the chemical delivery system 101 for directing a delivery procedure. In the embodiment shown, the central processor is contained within cabinet hardware 128 of the remote cabinet 125 and coupled to reactor hardware 176 of the reactor 175 by manifold wiring 155. In this manner, communication is provided between the central processor and the reactor hardware 176 which further directs a CVD procedure of the reactor 175 as described further below.

During a CVD procedure the bulk canister 105 may be depressurized by a conventional technique. The delivery line 115 is opened to allow a liquid chemical, such as high purity TEOS, to be removed from the bulk canister 105 and into the process canister 120 as directed through the manifold assembly 106. The manifold assembly 106 may simultaneously direct an inert gas, such as helium, into the bulk canister 105 to help force the high purity TEOS out of the bulk canister 105.

The process canister 120 includes a process level sensor 111 coupled to the central processor for indicating when the process canister 120 is filled. Once filled, the process canister 120 may deliver a liquid chemical therefrom to a storage chamber 177 of the reactor 175 through the transfer line 150 as described above.

Depending upon the parameters of the delivery procedure, the reactor hardware 176 directs the high purity liquid material from the storage chamber 177 to a reaction chamber 179 where a CVD technique is used to form a film of semiconductor material on a substrate.

As procedures such as that described above are run, the bulk canister 105 may periodically deliver liquid chemical to the process canister 120. The bulk canister 105 is configured for removal from the remote cabinet 125 and replacement. Thus, the bulk canister 105 includes a bulk level sensor 110 to indicate when replacement of the bulk canister 105 is required.

Before the bulk canister 105 is changed, a line purge procedure may be employed to ensure that any liquid chemical is removed from the delivery line 115. In one embodiment, purging is coordinated through the manifold assembly 106 wherein the bulk canister 105 is pressurized through the delivery line 115 following removal of high purity chemical therethrough. That is, once the bulk canister 105 is substantially emptied through the delivery line 115, air pressure is applied through the delivery line 115 in the opposite direction toward the bulk canister 105. The pressure applied may be in the range of between about 45 psi and about 60 psi. This purges the delivery line 115 forcing any remaining high purity liquid chemical back into the bulk canister 105.

Figure 2:
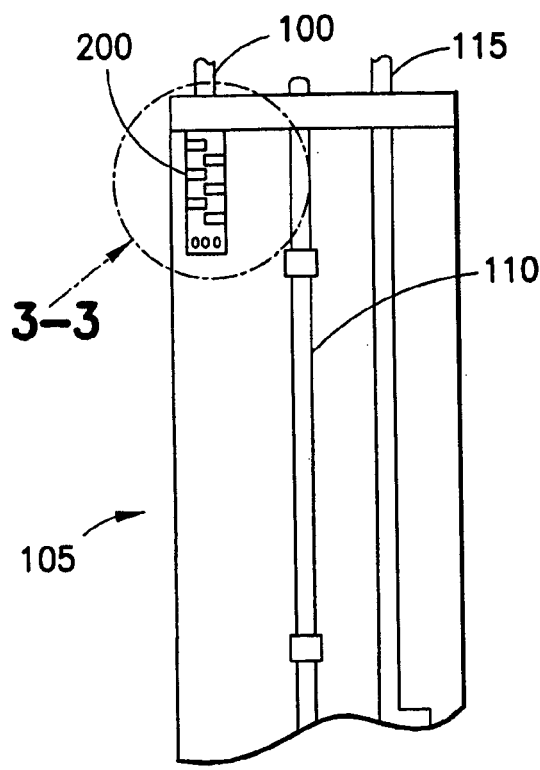
FIG. 2 is a side cross sectional view of the container taken from section lines 2—2 of FIG. 1 and having an embodiment of a canister guard.

Referring to FIGS. 1 and 2, the guarded coupling 100 is open as the purging described above takes place. This allows the escape of air, which may include an inert gas as described above, as pressure is applied to the bulk canister 105 during the pressure applied through the delivery line 115.

In the embodiment shown, purging as described above substantially removes all of the high purity chemical from the delivery line 115. Thus, the bulk canister 120 may be replaced without contamination or safety concerns through the delivery line 115. In order to ensure that similar concerns are not present with respect to the guarded coupling 100, a guard 200 is provided as described further herein.

Figure 5:
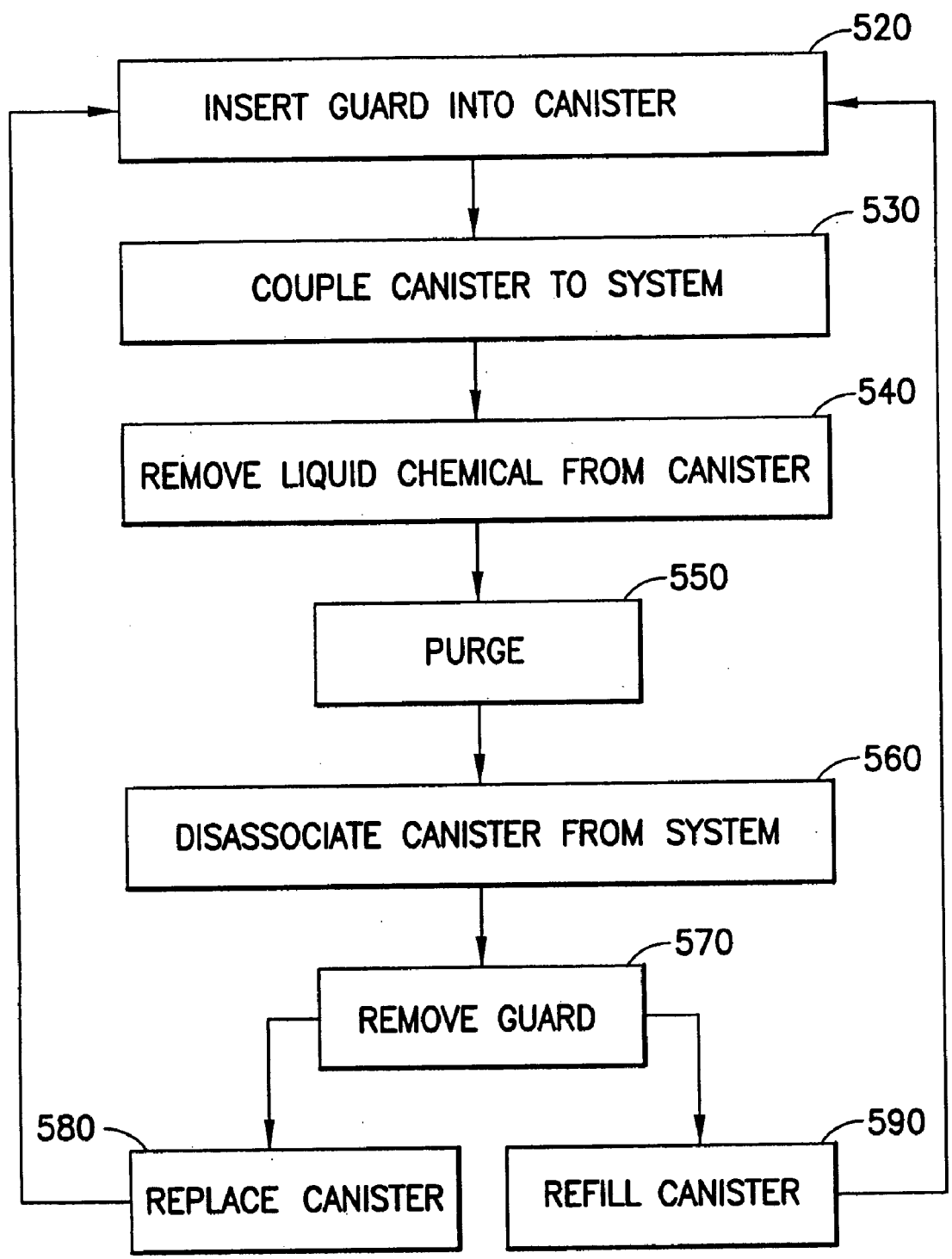
FIG. 5 is a flow-chart summarizing methods of employing a canister guard.

FIG. 5 is a flow-chart summarizing an embodiment of employing the guard 200 in a canister such as the bulk canister 120 during a liquid delivery and line purging process. FIG. 5 is referenced throughout the remainder of the specification as an aid in describing embodiments of the guard 200 and chemical delivery system 101 generally.

Referring now to FIGS. 2 and 5 a guard 200 is shown coupled to a guarded coupling 100 at the bulk canister 105 as indicated at 520. The guard 200 is about a 4 inch to 6 inch long shield that may be removably inserted into the bulk canister 105 as indicated at 520. The bulk canister 105 may then be coupled to the chemical delivery system 101 as indicated at 530 for removal of a liquid chemical therefrom as indicated at 540. Continuing with reference to FIG. 5, a purge, for example, of the delivery line 115, may be applied as indicated at 550. As the bulk canister 105 is pressurized through the delivery line 115 during purging, splattering and splashing of the high purity chemical may occur. As described below, the guard 200 is configured to prevent liquid chemical from escaping the bulk canister 105 through the guarded coupling 100.

Figure 3:
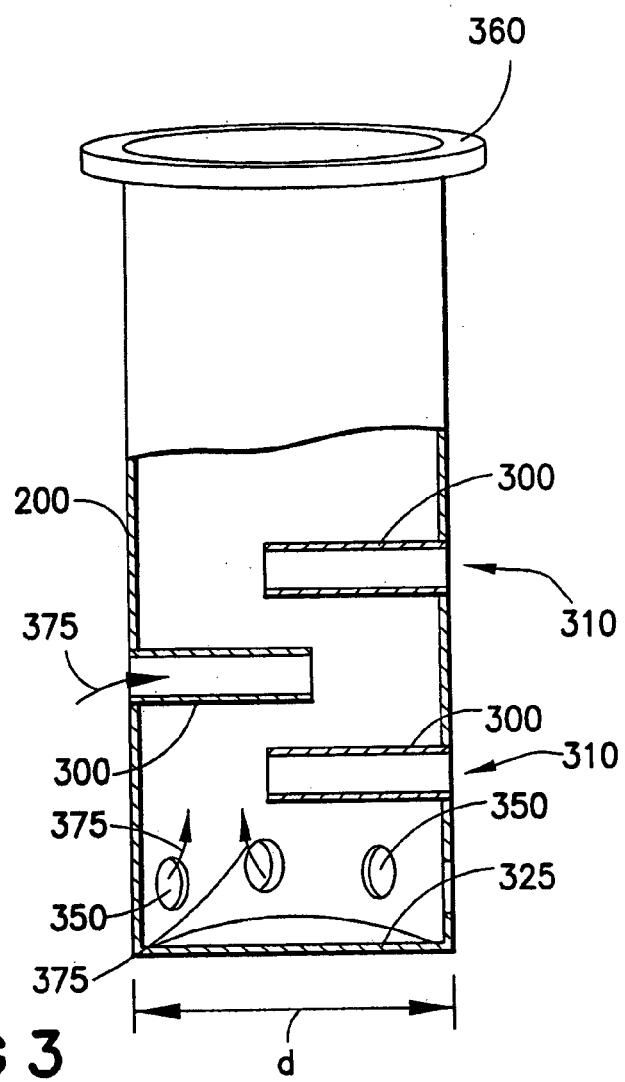
FIG. 3 is an exploded cross sectional view of the canister guard taken from section lines 3—3 of FIG. 2.

Referring to FIGS. 2 and 3, guard 200 is equipped with lower inlets 350 with baffle inlets 310 thereabove to allow air through to the guarded coupling 100 exterior of the bulk canister 105. As shown in FIG. 3, air may exit the bulk canister 105 during purging as shown by arrows 375. As described further herein, the air must traverse baffles 300 as it escapes the bulk canister 105. Thus, as the air escapes the bulk canister 105, the baffles 300 shield any high purity chemical from also escaping the bulk canister 105.

The guard 200 terminates at a sealed bottom 325 limiting the likelihood of high purity chemical entering the guard 200. Air may only enter the guard 200 through the lower inlets 350 and the baffle inlets 310 at the side of the guard 200. Once air enters the guard 200 it encounters and passes around the baffles 300 as described above. The baffles 300 may extend at least half the distance (d) across the guard 200 from sidewalls thereof. Thus, the baffles 300 may overlap one another to ensure that the path of air exiting through the guard 200 is not linear. In this manner, any high purity chemical traveling with the air as shown at arrows 375 must encounter the baffles 300. This configuration serves to block the high purity chemical from exiting the guard 200 with the exiting air. In one embodiment, the uppermost baffles 300 lack baffle inlets 310 in order to ensure that exiting air and any high purity chemical are forced to traverse lower positioned baffles 300. This further prevents any direct escape route of exiting air and high purity liquid chemical.

The guard 200 and baffles 300 may be formed of stainless steel, a synthetic fluorinated hydrocarbon, or other suitable material. The materials chosen may be selected based on the high purity chemical contained within the bulk canister 105, ease of manufacture, and other factors. Additionally, in one embodiment, the entire guard may be replaceable for cleaning and reuse with the same or another bulk canister 105 as described below.

Continuing with reference to FIGS. 2 and 3, a replaceable guard 200 may be used to retrofit currently existing bulk canisters 105. For example, where the guarded coupling 100 as shown in FIG. 2, couples to about a 1 inch orifice at the top of an industry standard bulk canister 105, the guard 200 may have a diameter (d) which does not exceed 1 inch. In such an embodiment, the guard 200 may be between about ½ and about ¾ inches allowing it to fit through the orifice at the top of the bulk canister 105. The guard 200 may further include a lip 360 greater than about 1 inch in diameter at the top thereof to allow the guard 200 to rest within the bulk canister 105 without falling through the orifice. In this embodiment, the lip 360 may rest at a rim of the orifice similar to a gasket for a conventional fitting for coupling to the guarded line 100. Similarly, in an alternate embodiment, where the orifice is about ½ inch in diameter, the guard may have a diameter (d) of between about ⅛ and about ¼ inches with a lip 360 exceeding about ½ inches in diameter.

With reference to FIGS. 1–3 and 5, once a purge of the delivery line 115, as indicated above, is complete, the bulk canister 120 may be disconnected of or disassociated from the chemical delivery system 101 as indicated at 560. The guard 200 may then be removed as indicated at 570. The user then has the option of refilling and reusing the bulk canister 120 with a new guard (see 540), coupling the used guard 200 to a new canister (see 580), or neither, before coupling the canister to the chemical delivery system 101 to begin delivery and purge anew.

Figure 4:
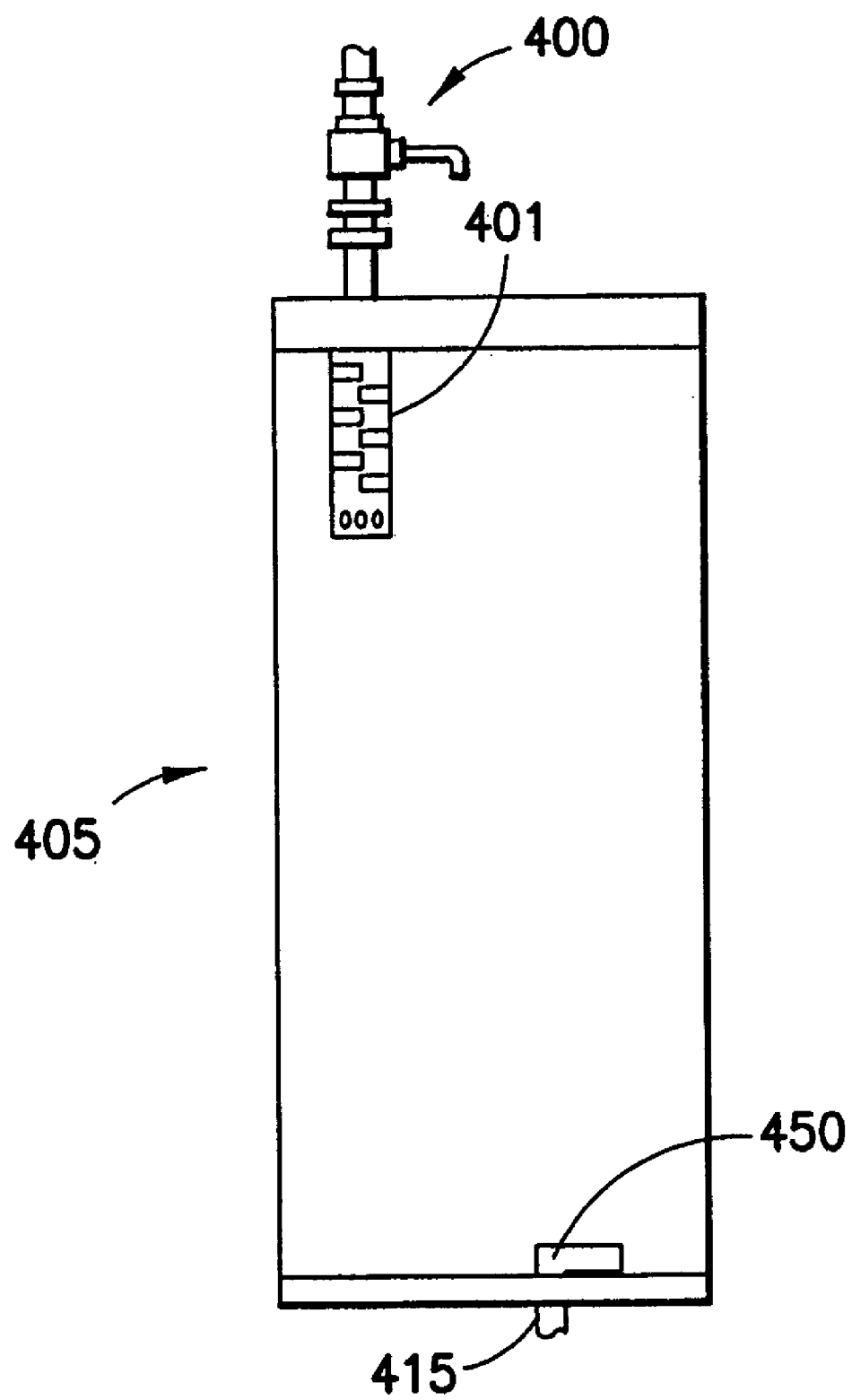
FIG. 4 is a side view of an alternate embodiment of a container having a canister guard.

Referring to FIG. 4 an alternate configuration of a bulk canister 405 is shown employing a guard 401. In the embodiment shown, the delivery line 415 enters the bulk canister 405 from a position opposite the guard 401 and guarded coupling 400. Preferably, the delivery line 415 enters from the bottom of the bulk canister 405 to facilitate emptying of the bulk canister 405. Additionally, the delivery line 415 terminates at an angled portion 450 within the bulk canister 405. The angled portion 450 is directed away from the guard 401 to discourage splashing of residual liquid chemical toward the guard 401 during purging as described above.

The embodiments described substantially prevent liquid chemical from exiting a canister through an outlet even though the canister is being pressurized through an inlet. In this manner a liquid chemical line of a liquid delivery system may be purged into the canister without subsequent contamination or health risk concerns once the canister is removed from the system. Although exemplary embodiments describe particular liquid delivery systems and guard configurations additional embodiments are possible. Additionally many changes, modifications, and substitutions may be made without departing from the spirit and scope of these embodiments.

We claim:

1. A canister guard for coupling to a canister at an outlet thereof and for preventing liquid chemical in the canister from exiting through the outlet when pressure is applied through a canister inlet of the canister, said canister guard comprising:
   an elongate housing enclosing an interior volume therewithin, said housing including a circumscribing sidewall, a closed bottom portion and a flow passage at an upper portion of the housing for egress of gas from the interior volume of the housing;
   circumferentially spaced-apart openings around a lower portion of the circumscribing sidewall, for flow of gas from outside of the housing into the interior volume thereof; and
   longitudinally spaced-apart flow-through baffles in the interior volume of the housing, each flow-through baffle being joined to a respective inlet opening in the circumscribing sidewall and extending from said inlet opening into the interior volume of the housing, with a discharge opening at an interior portion of the flow-through baffle, and an interior passage joining the inlet opening and the discharge opening, for flow of gas from outside of the housing through inlet openings, interior passages and discharge openings of the flow-through baffles into the interior volume of the housing,
   whereby when pressure is applied through an inlet of the canister, gas flows into the interior volume of the housing through (i) the circumferentially spaced-apart openings around the lower portion of the circumscribing sidewall and (ii) the longitudinally spaced-apart flow-through baffles, so that gas egresses from the housing through said flow passage at the upper portion of the housing and liquid escape from the canister is restrained during such gas egress.

2. The canister guard of claim 1 for removably coupling to the canister.

3. The canister guard of claim 1 comprised of one of stainless steel and a synthetic fluorinated hydrocarbon.

4. The canister guard of claim 1 wherein the discharge opening at the interior portion of the flow-through baffle comprises an open interior end of the flow-through baffle.

5. The canister guard of claim 4 wherein each flow-through baffle comprises a solid wall bounding the interior passage of the flow-through baffle, and extending from the inlet opening in the circumscribing sidewall to the open interior end of the flow-through baffle.

6. The canister guard of claim 5 wherein said housing has a cylindrical shape.

7. The canister guard of claim 5 having a transverse dimension, with each said flow-through baffle extending a distance from said sidewall at least about half of the transverse dimension.

8. The canister guard of claim 7 wherein said transverse dimension is between about ⅛ inches and about ¾ inches.

9. The canister guard of claim 1, wherein said flow-through baffles extend transversely into the interior volume of the housing so that successive adjacent flow-through baffles transversely overlap one another.

10. The canister guard of claim 1 having a length of between about 4 inches and about 6 inches.

11. The canister guard of claim 1 further comprising non-flow baffles in the interior volume of the housing.

12. The canister guard of claim 11, wherein the non-flow baffles are positioned above the flow-through baffles.

13. The canister guard of claim 1 further comprising a lip for removably securing said canister guard at the outlet.

14. A canister for containing liquid chemical, said canister comprising a canister guard as claimed in claim 1 over an outlet of the canister for preventing liquid chemical from exiting therethrough when pressure is applied through a canister inlet of the canister.

15. The canister of claim 14 wherein said canister guard is removable.

16. The canister of claim 14 wherein said canister guard includes a lip circumscribing the flow passage at the upper portion of the housing, and engageable with the outlet of the canister.

17. The canister of claim 14 wherein the canister inlet is located at said canister substantially opposite the outlet.

18. A liquid delivery system comprising:
   a remote cabinet;
   a canister housed in said remote cabinet and having a canister guard as claimed in claim 1 over an outlet thereof for preventing liquid from exiting therethrough when pressure is applied through a canister inlet of said canister; and a reactor coupled to said remote cabinet to receive a portion of the liquid.

19. The liquid delivery system of claim 18 wherein the canister contains a liquid, and the liquid includes one of tetramethylorthosilicate, titanium tetramethylcyclotetrasiloxane, tetrakis dimethylamino titanium, tetramethylborate, triethylborate, trimethylphosphate, triethylphosphate, trimethylphosphite and trimethyl silane.

20. The liquid delivery system of claim 18 wherein said reactor is a chemical vapor deposition apparatus.

21. The liquid delivery system of claim 18 wherein said canister is a bulk canister coupled to a process canister in said remote cabinet via the canister inlet.

22. The liquid delivery system of claim 21 wherein the bulk canister and the process canister include level sensors.

23. The liquid delivery system of claim 21 wherein the bulk canister is replaceable.

24. A method comprising purging a liquid from a line coupled to a canister at an inlet thereof, the canister including a canister guard as claimed in claim 1 at a canister outlet thereof for substantially preventing the liquid from exiting through the canister outlet.

25. The method of claim 24 wherein the canister is a first canister and further comprising:
disassociating the first canister from the line;
removing the canister guard from the first canister; and
replacing the first canister with a second canister.

26. The method of claim 24 further comprising:
disassociating the canister from the line; and
filling the canister with liquid.

* * * * *